(12) United States Patent
Wang

(10) Patent No.: US 7,568,970 B2
(45) Date of Patent: Aug. 4, 2009

(54) CHEMICAL MECHANICAL POLISHING PADS

(75) Inventor: Dapeng Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/447,741

(22) Filed: Jun. 5, 2006

(65) Prior Publication Data
US 2006/0229008 A1 Oct. 12, 2006

Related U.S. Application Data

(60) Continuation of application No. 10/729,112, filed on Dec. 5, 2003, now Pat. No. 7,186,168, which is a division of application No. 09/617,692, filed on Jul. 17, 2000, now Pat. No. 6,666,751.

(51) Int. Cl.
*B24B 7/22* (2006.01)
(52) U.S. Cl. .......................... 451/288; 451/533
(58) Field of Classification Search .................. 451/41, 451/287, 288, 526–530, 533
See application file for complete search history.

(56) References Cited

U.S. PATENT DOCUMENTS

| | | | |
|---|---|---|---|
| 5,212,910 A | 5/1993 | Breivogel et al. | |
| 5,232,875 A | 8/1993 | Tuttle et al. | |
| 5,257,478 A | 11/1993 | Hyde et al. | |
| 5,514,245 A | 5/1996 | Doan et al. | |
| 5,564,965 A | 10/1996 | Tanaka et al. | |
| 5,624,299 A | 4/1997 | Shendon | |
| 5,664,989 A * | 9/1997 | Nakata et al. | 451/41 |
| 5,692,947 A | 12/1997 | Talieh et al. | |

(Continued)

FOREIGN PATENT DOCUMENTS

JP 57023965 A 2/1982

(Continued)

OTHER PUBLICATIONS

Wang et al., *Von Mises Stress in Chemical-Mechanical Polishing Process*, J. Electrochem. Soc., vol. 144, No. 3, Mar. 1997, pp. 1121-1127.

*Primary Examiner*—Robert Rose
(74) *Attorney, Agent, or Firm*—TraskBritt

(57) ABSTRACT

The present invention provides a deformable pad useful for chemical mechanical polishing ("CMP"), a CMP apparatus incorporating the deformable pad of the present invention, and methods for using the deformable pad and CMP apparatus of the present invention. The deformable pad of the present invention includes a plurality of solid supports which substantially eliminate the nonuniform polishing rates in known CMP processes and may be tailored to optimize a wide array of CMP processes. The CMP apparatus of the present invention incorporates a deformable pad of the present invention and may include several other known features, such as a polishing pad, a substrate carrier, mechanical assemblies for agitating the polishing pad or substrate carrier, etc. The methods falling within the scope of the present invention include providing a CMP polishing apparatus, providing a deformable pad of the present invention, providing a polishing pad attached to the deformable pad of the present invention, and bringing a substrate having a material layer to be polished in contact with the polishing pad. As will be appreciated by one of skill in the art, the CMP apparatus and the methods of the present invention may be easily adapted for use in virtually all CMP processes.

8 Claims, 13 Drawing Sheets

U.S. PATENT DOCUMENTS

| | | |
|---|---|---|
| 5,692,950 A | 12/1997 | Rutherford et al. |
| 5,853,317 A | 12/1998 | Yamamoto |
| 5,876,269 A | 3/1999 | Torii |
| 5,899,745 A | 5/1999 | Kim et al. |
| 6,217,426 B1 * | 4/2001 | Tolles et al. ................. 451/285 |
| 6,498,101 B1 | 12/2002 | Wang |
| 6,561,891 B2 | 5/2003 | Eppert et al. |
| 6,666,751 B1 | 12/2003 | Wang |

FOREIGN PATENT DOCUMENTS

| | | |
|---|---|---|
| JP | 58045861 A | 3/1983 |
| JP | 05505769 | 8/1993 |
| JP | 05285825 | 11/1993 |

* cited by examiner

CHEMICAL MECHANICAL POLISHING PADS

CROSS-REFERENCE TO RELATED APPLICATIONS

This application is a continuation of application Ser. No. 10/729,112, filed Dec. 5, 2003, now U.S. Pat. No. 7,186,168, issued Mar. 6, 2007, which application is a divisional of application Ser. No. 09/617,692, filed Jul. 17, 2000, now U.S. Pat. No. 6,666,751, issued Dec. 23, 2003.

STATEMENT REGARDING FEDERALLY SPONSORED RESEARCH OR DEVELOPMENT

This invention was made with United States Government support under contract No. DABT63-97-C-0001 awarded by the Advanced Research Projects Agency (ARPA). The United States Government has certain rights in this invention.

BACKGROUND OF THE INVENTION

1. Field of the Invention

This invention relates generally to methods for forming a uniform layer of material on a substrate, such as a semiconductor wafer. More particularly, the invention relates to a polishing pad for chemical mechanical polishing (CMP), a polishing apparatus, and methods for using the same.

2. State of the Art

In the fabrication of semiconductor devices, it is often necessary to planarize or polish material layers of an intermediate semiconductor structure before the intermediate device may be subjected to further process steps, such as, for example, deposition, patterning, or etching steps. Planarization is used to achieve material layers of uniform thickness and to remove undesirable surface topography, scratches, roughness, embedded particles, or other defects which may adversely effect the consistency or effectiveness of subsequent process steps. One of the most widely utilized planarization processes is CMP.

CMP is an abrasive planarization process which generally involves agitating a material layer to be polished against a wetted polishing surface under controlled chemical, pressure, and temperature conditions. FIG. 1A shows an exemplary CMP apparatus 10 having a rotatable platen, or table 12, and a polishing pad 14 mounted to a top surface 16 of the rotatable table 12. A carrier film (not illustrated in FIG. 1A) may also be placed between the polishing pad 14 and the top surface 16 of the rotatable table 12 to protect the top surface 16 of the rotatable table 12. Such a film may be provided to protect the top surface 16 of the rotatable table 12 from scratches and chemical degradation or contamination.

The CMP apparatus of FIG. 1A also includes a rotatable substrate carrier 18 configured to hold a semiconductor substrate 20 (such as, by way of example, a silicon wafer) bearing a material layer 25 to be polished. The substrate carrier 18 exerts a downward force, indicated by arrow 22, normal to the surface 24 of the material layer 25 to be polished, creating a pressure between the surface 24 of the material layer 25 to be polished and the polishing surface 26 of the polishing pad 14. The rotatable substrate carrier 18 may be designed to exert varying amounts of force against the semiconductor substrate 20 and may utilize various, well-known technologies, such as mechanical affixation, vacuum affixation, frictional affixation, or any other suitable technique, to hold the semiconductor substrate 20 in place during polishing.

As is also shown in FIG. 1A, both the rotatable substrate carrier 18 and the rotatable table 12 may be rotated or otherwise placed in motion to provide the agitation necessary for polishing. The rotatable table 12 is rotated in a first direction 28 by a first known mechanical assembly 30, such as, for example, a first electric motor. The rotatable substrate carrier 18 may be rotated in a second direction 32 by a second known mechanical assembly 34, such as, for example, a second electric motor. The second direction 32 may be the same rotational direction as the first direction 28. Moreover, the substrate carrier 18 may provide further agitation through movement in a plane, indicated by arrow 36, parallel to the top surface 16 of the rotatable table 12.

FIG. 1B illustrates an alternative CMP apparatus that does not employ a rotatable platen. Instead, the CMP apparatus of FIG. 1B includes a linear polisher 2 and a substrate carrier 3 for holding the substrate 4 to be polished. The linear polisher 2 includes an endless belt 5, which is movable in a continuous path and is supported by a belt support 6. A polishing pad 7 is attached to the endless belt 5, and the polishing pad 7 is positioned to engage the substrate surface 8. The polishing pad 7 is moved in a linear direction relative to the substrate 4, and in order for polishing to occur at random incidence, the substrate carrier 3 preferably rotates the substrate 4 relative to the polishing pad 7 affixed to the endless belt 5. CMP machinery including linear polishing mechanisms is currently thought to provide improved polishing relative to machinery utilizing rotatable polishing tables.

Regardless of the machinery used, as is illustrated in FIG. 1A, a wetting agent 38, generally a chemical slurry 40, is often supplied through a conduit 42 and onto the polishing surface 26 of the polishing pad 14. The wetting agent 38 generally contains a polishing agent, such as alumina, silica, or fused silica, carried in an ammonium hydroxide solution or the like, which serves as an abrasive material. Additionally, the wetting agent 38 may contain other chemicals which selectively etch or degrade particular features of the material layer 25 to be polished. However, as the dimensions of features included in state of the art semiconductor devices shrink, chemically active slurries have fallen out of favor in some CMP applications, as it is very difficult to control the etch rate of chemically active constituents during a CMP process. Therefore, as used in the context of the present invention, the terms "chemical mechanical polishing" and "CMP" indicate abrasive polishing processes that employ chemically inert slurries, as well as polishing processes employing chemically active slurries.

The effect of CMP is illustrated in FIGS. 2 through 4. Each of these figures illustrates an incomplete semiconductor device 44 before or after undergoing CMP. However, the application of CMP processes is not limited to incomplete semiconductor devices having the characteristics illustrated in FIGS. 2 through 4. As is well-known by those of ordinary skill in the art, CMP processes may be applied to a wide range of semiconductor devices at various stages of fabrication. Moreover, as is also well-known, CMP process parameters are variable, depending on the desired result and the characteristics of the substrate being polished. The structures and results depicted in FIGS. 2 through 4 are therefore provided for illustrative purposes only.

FIG. 2 depicts an incomplete semiconductor device 44 including a portion of a semiconductor substrate 46, such as a wafer, a lower wiring layer 48, and a material layer 50, such as an interlayer dielectric film. Due to the topography created by the lower wiring layer 48, the upper surface 52 of the material layer 50 is irregular, including a plurality of peaks 54 and valleys 56. Before further processing occurs, however, it is desirable to eliminate the peaks 54 and valleys 56, creating a material layer having a planar surface and a uniform thickness (not shown in FIG. 2).

FIG. 3 illustrates the incomplete semiconductor device 44 of FIG. 2 after the incomplete semiconductor device 44 has undergone a desirable CMP process. Ideally, the CMP process results in a uniformly thick material layer 58 with a planar top surface 60, enabling subsequent process steps that consistently produce reliable device features. However, nonuniformity of polishing rate is a serious problem inherent in known CMP processes, and consistently achieving material layers having planar top surfaces and a uniform thickness across the entire surface of the material layer being polished has proven difficult.

FIG. 4 illustrates the incomplete semiconductor device 44 of FIG. 2 following a more typical CMP process. At least in some areas of the polished surface, the nonuniform polishing rate of a typical CMP process results in an incomplete semiconductor device 44 having a nonuniform material layer 62 and a top surface 64 that slopes (greatly exaggerated for clarity) or is otherwise irregular. It must be emphasized, however, that FIG. 4 depicts only one type of irregularity caused by known CMP processes. The results obtained by any CMP process will depend on the material being polished, the unique characteristics of the features formed by the material being polished, and numerous process parameters such as the type of slurry, the amount of agitation, the material, the characteristics of the polishing pad, and the amount of pressure exerted between the material being polished and the polishing pad.

However, in order to produce reliable, high-quality semiconductor devices, particularly in light of the decreasing feature size and increasing complexity of state-of-the-art semiconductor devices, CMP processes must produce polished material layers having uniform thicknesses across the entire semiconductor substrate. Among other problems, material layers exhibiting nonuniform thicknesses cause difficulty in depositing uniform resist layers, prevent photolithographic devices from accurately focusing a pattern over the surface of a resist layer to be processed, and often lead to over- or under-etching of desired device features. Thus, CMP processes providing a uniform polishing rate are an absolute necessity for fabrication of leading edge semiconductor devices including device features measuring approximately 0.18 micron, or less, and such processes will be invaluable as feature dimensions sink below current standards.

It is believed that the nonuniform polishing rate of state-of-the-art CMP processes is at least partially due to nonuniform von Mises stresses exerted between the polishing surface of the polishing pad and the semiconductor substrate surface being polished (see, *Von Mises Stress in Chemical-Mechanical Polishing Processes*, D. Wang, J. Lee, K. Holland, T. Bibby, S. Beaudoin, and T. Cale, J. Electrochem. Soc., Vol. 144, No. 3, March 1997). As the material layer to be polished is placed in contact and agitated relative to the polishing surface of the polishing pad, the polishing pad and any material underlying the polishing pad, such as a carrier layer, deform in response to the surface topography of the material layer being polished as well as normal and shearing forces exerted during agitation. Nonuniform von Mises stresses result from an accumulation of such deformation in the polishing pad and any material layers underlying the polishing pad, and nonuniform von Mises stresses become particularly problematic at the peripheral edge of the surface of the material layer being polished.

Several devices have been proposed to eliminate the nonuniform pressures believed to cause inconsistent polishing rates. For example, various polishing pads have been proposed which either incorporate a layer of elastic material or are mounted on a layer of elastic material. Such polishing pads are exemplified by the technologies disclosed in U.S. Pat. No. 5,692,950 and Japanese Patent Disclosures Nos. 58-45861 and 57-23965. While the layers of elastic material disclosed in these references enable the polishing pad to more accurately conform to the global topography of the material surface being polished, the technologies disclosed in these references still produce nonuniform von Mises stresses by allowing an accumulation of deformation of the polishing pad at the edge of the substrate surface being polished. This "edge effect" significantly reduces the polish rate at the edge of the surface being polished, thereby reducing the uniformity of the polished material layer, decreasing production yields, and potentially compromising long-term reliability of the devices ultimately fabricated.

Other proposals aimed at increasing the polishing uniformity of CMP processes call for cells filled with a gas or liquid to be disposed between an upper surface of the rotatable table and a lower surface of the polishing pad. For example, U.S. Pat. No. 5,664,989 and Japanese Patent Disclosures Nos. 5-285825 and 5-505769 each disclose the disposition of one or more cells filled with a gas or liquid between the polishing pad and the rotating table. However, these technologies also fail to adequately alleviate the nonuniformity of known CMP processes.

The shortcomings of the technologies disclosed in U.S. Pat. No. 5,664,989 and Japanese Patent Disclosures Nos. 5-285825 and 5-505769 can be at least partially traced to the physical characteristics of the gas or liquid filled cells themselves. First, the cells disclosed in these references are relatively fragile and susceptible to damage, especially when subjected to the chemical and mechanical stresses associated with CMP processes and the maintenance of CMP devices. Thus, the functional life of deformable CMP pads incorporating cells filled with a gas or liquid is relatively short. Second, deformable pads incorporating gas or liquid filled cells also allow nonuniform von Mises stresses, resulting in undesirable edge effects, and the physical properties of gas or liquid filled cells are relatively difficult to modify or control. Thus, the deformable pads disclosed in U.S. Pat. No. 5,664,989 and Japanese Patent Disclosures Nos. 5-285825 and 5-505769 are fragile, do not provide adequate polishing uniformity, and exhibit physical characteristics that are relatively difficult to modify for optimization of a variety of CMP processes.

Therefore, it would be an improvement in the art to provide a durable and cost effective device that significantly enhances the polishing uniformity of CMP processes, substantially reduces any edge effects, and is easily tailored for application in a variety of CMP processes.

SUMMARY OF THE INVENTION

The present invention provides a deformable pad, a CMP apparatus, and methods of using the disclosed deformable pad and CMP apparatus that answer the foregoing needs.

The deformable pad of the present invention includes a top surface, a bottom surface and a plurality of solid supports. The solid supports of the deformable pad are made of one or more solid materials and are capable of elastic deformation, allowing the deformable pad to deform without exerting significantly different pressures across the surface of a material layer being polished. As used in the context of this invention, the term "solid" excludes materials including entrapped cells of gas or liquid, such as foamed materials. The solid supports of the deformable pad of the present invention are, therefore, durable and easily withstand the mechanical and chemical stresses experienced during CMP processes and the maintenance of CMP machinery. Moreover, because each of the solid supports included in the deformable pad is isolated, the deformable pad of the present invention effectively inhibits the edge effects caused by other known deformable CMP pads.

In addition, the design of the deformable pad of the present invention is highly variable. For example, the deformable pad may include only a plurality of solid supports, or the deformable pad may include a plurality of solid supports attached to a ventral layer, a dorsal layer, or both ventral and dorsal layers. Further, the size, shape, quantity, distribution, and material composition of the solid supports included in a deformable pad of the present invention can be easily varied in order to optimize polishing uniformity in a variety of CMP applications. The deformable pad of the present invention, therefore, provides a durable and cost effective device that significantly enhances the polishing uniformity of CMP processes, substantially reduces any edge effects, and is easily tailored for application in a variety of CMP processes.

The CMP apparatus of the present invention includes a deformable pad of the present invention used in conjunction with known polishing machinery. For example, the polishing apparatus of the present invention may include a polishing table including an upper surface, a deformable pad of the present invention, and a polishing pad including a bottom surface and a polishing surface. The deformable pad of the present invention is disposed between the upper surface of the polishing table and the bottom surface of the polishing pad, thereby enabling the polishing surface of the polishing pad to conform to the topography of the surface of the material layer of a substrate being polished. The CMP apparatus of the present invention may also include further features, such as a first mechanical assembly for driving the polishing table, a substrate carrier, a second mechanical assembly for driving the substrate carrier, as well as a carrier film disposed between the deformable pad of the present invention and the polishing pad. As will be apparent to those of skill in the art, the CMP apparatus of the present invention may be tailored to suit the process parameters of various CMP processes.

Alternatively, the polishing apparatus of the present invention may include a linear polisher. A linear polishing apparatus of the present invention includes a continuous belt having upper and lower surfaces and a deformable pad of the present invention attached to the upper surface of the continuous belt. A polishing pad is attached to the deformable pad of the present invention and is, therefore, movable along with the continuous belt in a continuous, linear path. A linear polishing apparatus of the present invention also includes a substrate carrier. In a preferred embodiment, the substrate carrier of a linear polishing apparatus of the invention rotates as the continuous belt and associated deformable pad and polishing pad are placed in motion relative to the substrate being polished.

The present invention also includes a method for CMP. The method of the present invention requires providing a deformable pad according to the present invention and may include providing a CMP apparatus of the present invention. The method of the present invention further includes providing a polishing pad and a substrate to be polished, and rotating, or otherwise placing in motion, the polishing pad relative to the substrate to be polished, the substrate relative to the polishing pad, or placing both the polishing pad and substrate in motion. Again, as will be appreciated by those of skill in the art, the parameters of the process of the present invention may be adapted to suit a wide spectrum of CMP needs.

Other features and advantages of the present invention will become apparent to those of skill in the art through a consideration of the ensuing description, the accompanying drawings, and the appended claims.

DETAILED DESCRIPTION OF THE PREFERRED EMBODIMENTS

The present invention includes a deformable pad useful in CMP processes. The deformable pad of the present invention may be sized and shaped as desired and includes top and bottom surfaces and a plurality of solid supports. Moreover, the physical properties of the deformable pad of the present invention are easily tailored to optimize polishing uniformity in a variety of CMP applications. The deformable pad of the present invention is therefore broadly applicable to a wide variety of CMP processes.

Figure 1A:
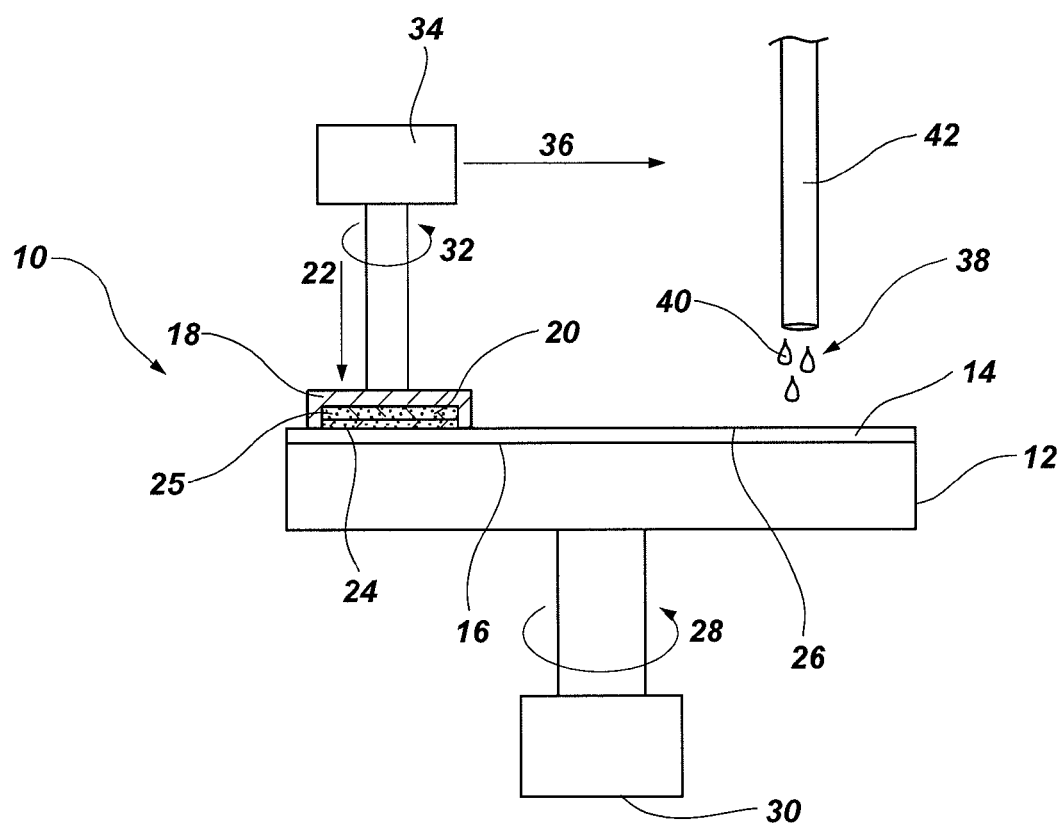
FIG. 1A provides a schematic representation of a first conventional CMP apparatus as is known in the art.
Figure 1B:
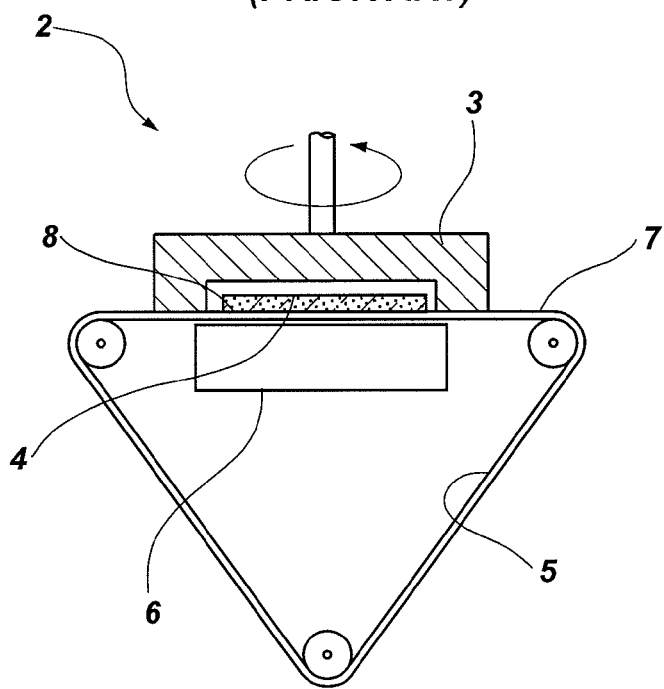
FIG. 1B provides a schematic representation of a second conventional CMP apparatus as is known in the art.
Figure 2:
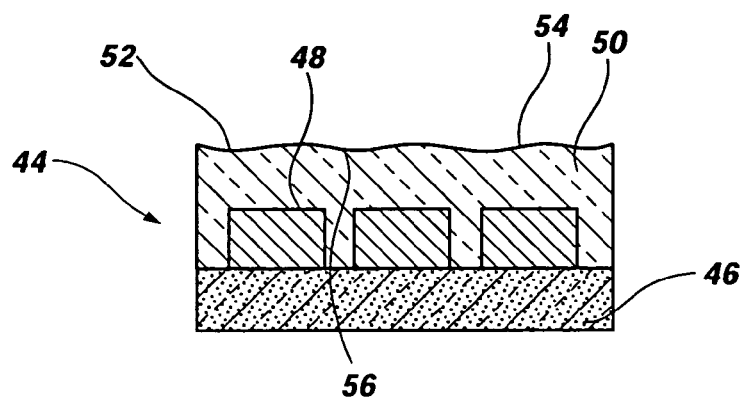
FIG. 2 provides a schematic representation of a cross-section of a portion of an intermediate semiconductor device formed on a semiconductor substrate, such as a wafer.
Figure 3:
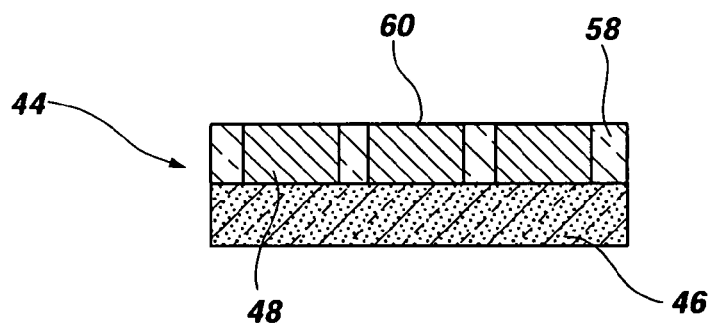
FIG. 3 schematically illustrates the intermediate semiconductor device of FIG. 2 after such device has undergone a desirable CMP process.
Figure 4:
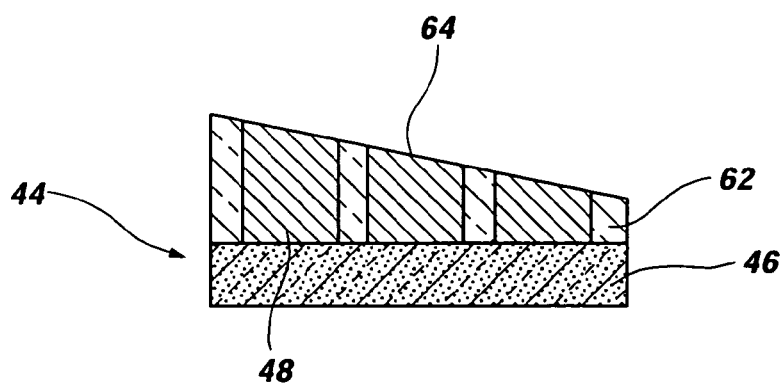
FIG. 4 schematically illustrates the intermediate semiconductor device of FIG. 2 after such device has undergone an unsatisfactory CMP process.
Figure 5:
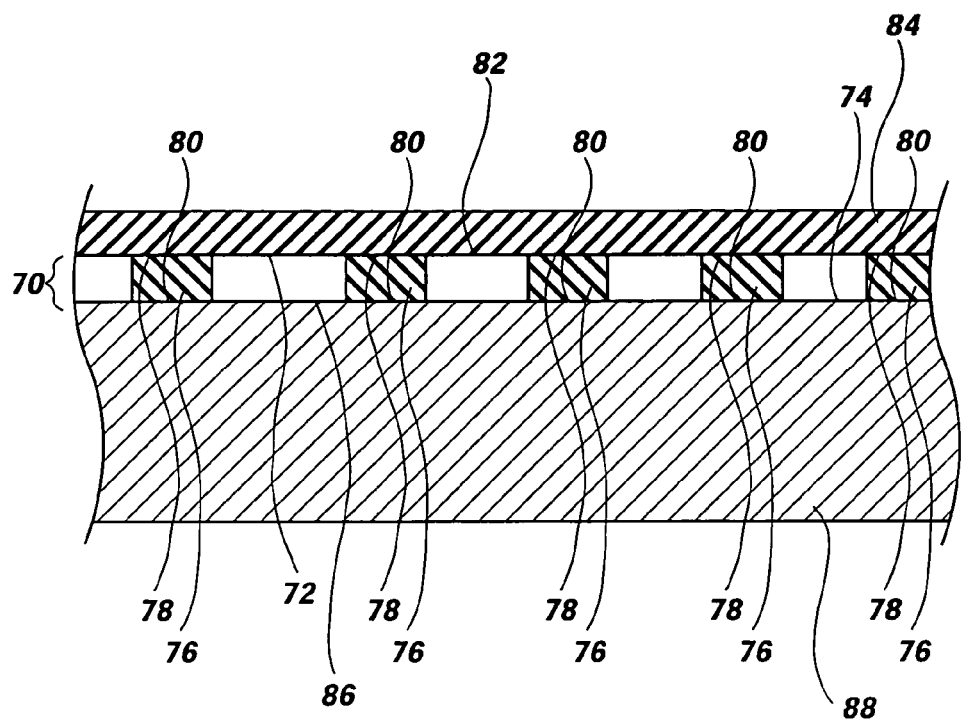
FIG. 5 provides a schematic depiction of a cross-section of a portion of a polishing table useful for CMP and having a first embodiment of a deformable pad of the present invention attached thereto.

A portion of a CMP apparatus having a first embodiment of the deformable pad of the present invention attached thereto is illustrated in FIG. 5. In the first embodiment, the top surface and bottom surface of the deformable pad 70 are discontinuous. In such an embodiment, the deformable pad 70 of the present invention includes only a plurality of solid supports 76, with the top surfaces 78 of the solid supports 76 forming the discontinuous top surface 72 of the deformable pad 70 and the bottom surfaces 80 of the solid supports 76 forming the discontinuous bottom surface 74 of the deformable pad 70. Where the deformable pad 70 of the present invention includes only a plurality of solid supports 76, the top surfaces 78 of the solid supports 76 forming the discontinuous top surface 72 of the deformable pad 70 are attached directly to the lower surface 82 of a polishing pad 84 by means known in the art, such as double-sided tape or, preferably, pressure sensitive adhesive, and the bottom surfaces 80 of the plurality of solid supports 76 forming the discontinuous bottom surface 74 of the deformable pad 70 are indirectly or directly attached to the upper surface 86 of a polishing table 88 using known attachment means such as those used to attach the discontinuous top surface 72 of the deformable pad 70 to the lower surface 82 of the polishing pad 84.

Figure 6:
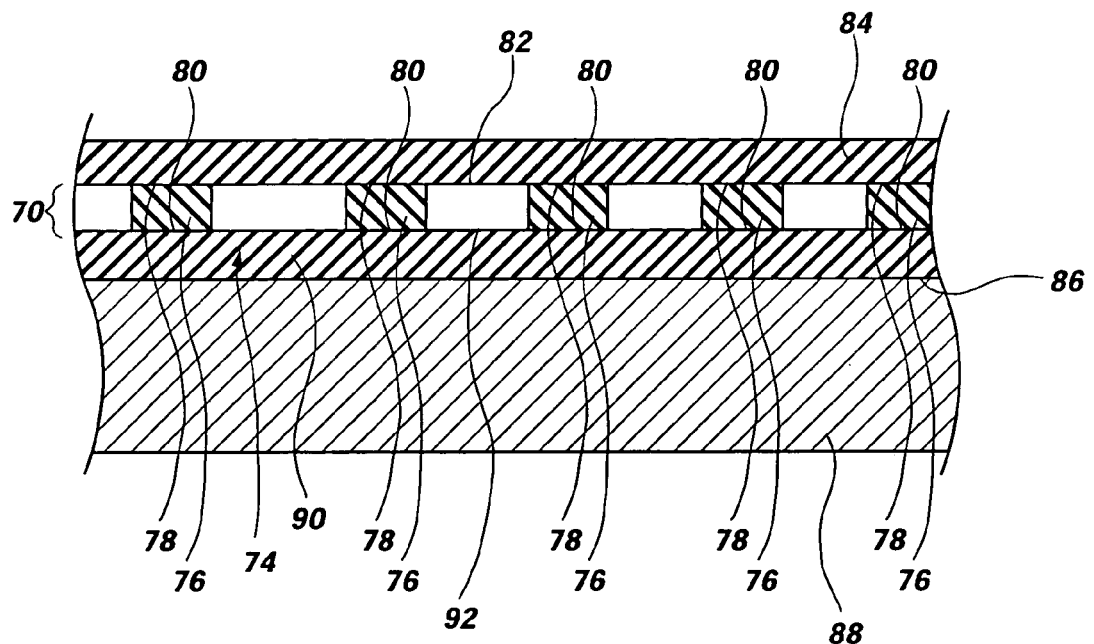
FIG. 6 provides a schematic illustration of a cross-section of a portion of a polishing table useful for CMP having a carrier film, the first embodiment of the deformable pad of the present invention, and a polishing pad attached thereto.

FIG. 5 illustrates the direct attachment of the bottom surfaces 80 of the plurality of solid supports 76 to the upper surface 86 of the polishing table 88. However, as mentioned, the bottom surfaces 80 of the plurality of solid supports 76 may also be indirectly attached to the upper surface 86 of the polishing table 88. For example, as shown in FIG. 6, an additional layer of material 90, such as a protective RODEL® SUBA IV pad, may be directly attached to the upper surface 86 of the polishing table 88 in order to prevent scratching or degradation of the upper surface 86. Where an additional layer of material 90 is included on the upper surface 86 of the polishing table 88, the bottom surfaces 80 of the plurality of solid supports 76 are attached to an upper surface 92 of the additional layer of material 90, thereby indirectly attaching the discontinuous bottom surface 74 of the deformable pad 70 to the upper surface 86 of the polishing table 88. The discontinuous bottom surface 74 of the deformable pad 70 may be attached to the upper surface 92 of the additional layer of material 90 using known means such as those already discussed.

Figure 7:
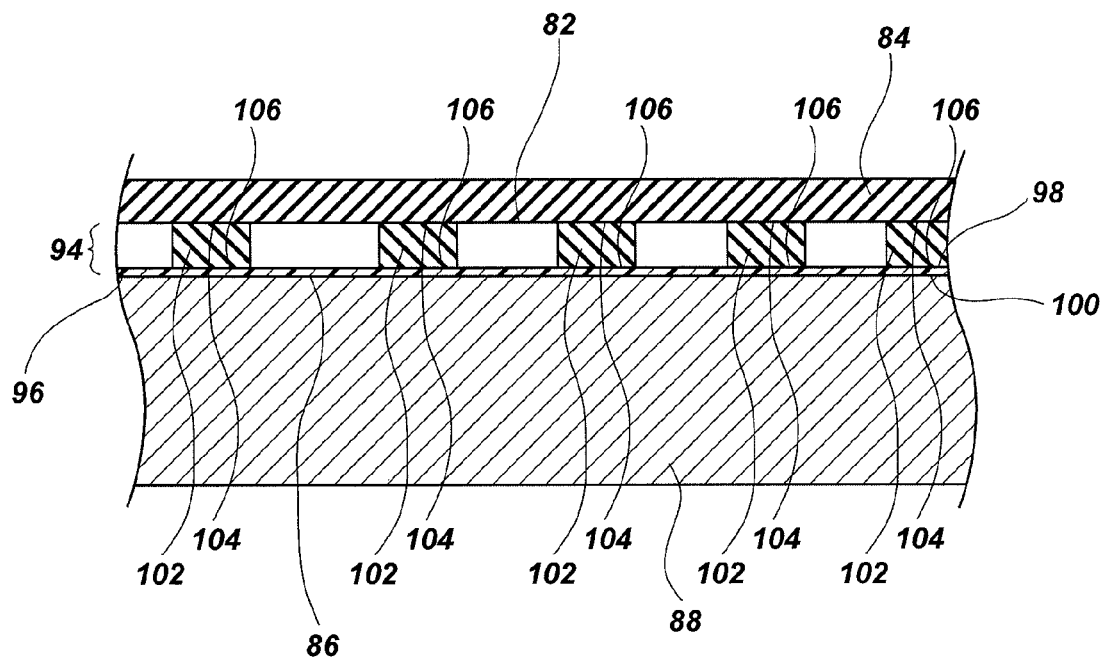
FIG. 7 provides a schematic illustration of a cross-section of a portion of a polishing table useful for CMP having a deformable pad according to a second embodiment of the deformable pad of the present invention attached thereto.

FIG. 7 illustrates a second embodiment of the deformable pad 94 of the present invention. In this embodiment, the deformable pad 94 includes a ventral layer 96 having a top surface 98 and a continuous bottom surface 100. The deformable pad 94 also includes a plurality of solid supports 102 having top surfaces 104 and bottom surfaces 106. The bottom surfaces 106 of the plurality of solid supports 102 are attached to the top surface 98 of the ventral layer 96 using known means, such as, preferably, pressure sensitive adhesive. Alternatively, as is shown in FIG. 8, the plurality of solid supports 102 may be formed integrally with the ventral layer 96.

A ventral layer of a deformable pad of the present invention may be fabricated using a variety of materials. For example, a ventral layer may be fabricated using natural or synthetic rubbers, thermoplastic elastomers, or woven or unwoven fabrics, including impregnated fabrics, such as polyurethane impregnated felt. Additionally, a ventral layer may include nonresilient materials, such as organic or inorganic polymers, ceramics, metals, such as aluminum, stainless steel, and copper, or reinforced organic or inorganic polymers or, preferably, pressure sensitive adhesive. However, such materials are provided for example only. As can be appreciated by one of ordinary skill in the art, a ventral layer may be fabricated of any number of materials chosen to optimize performance characteristics such as resiliency, stiffness, durability, or adhesion. Moreover, a ventral layer may be a composite material including two or more materials or material layers. Ventral layers composed of composite materials may be formed to provide performance characteristics not available from any one material.

Figure 8:
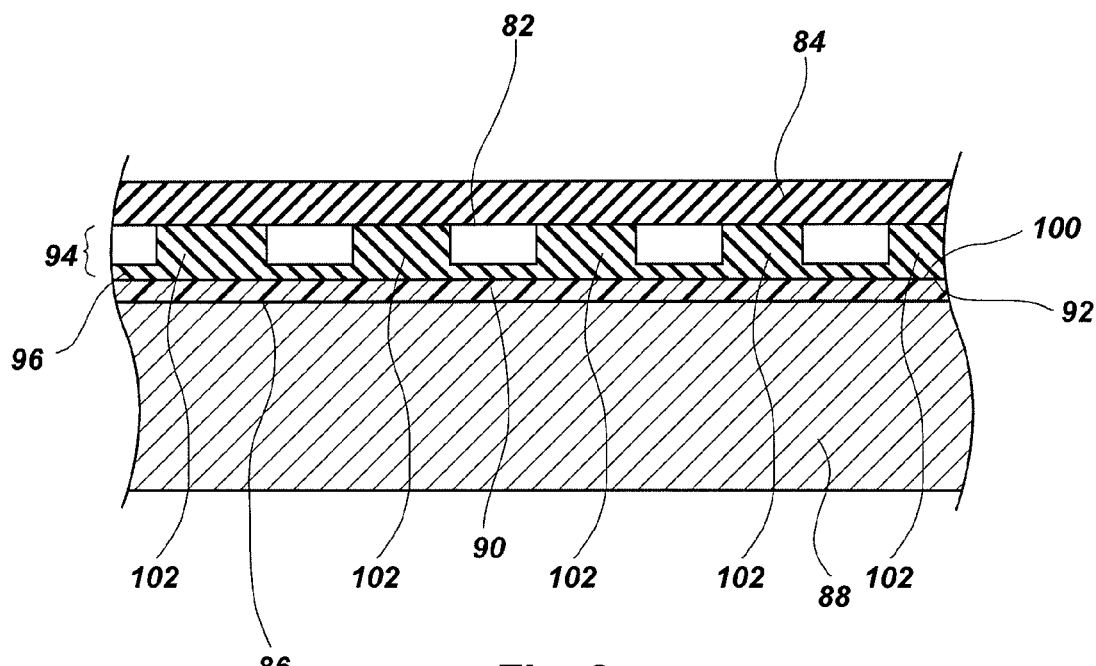
FIG. 8 provides a schematic illustration of a deformable pad according to the second embodiment of the deformable pad of the present invention having a ventral layer formed integrally with a plurality of solid supports and being indirectly attached to an upper surface of a polishing table useful in CMP processing.

As can be seen in FIG. 7 and FIG. 8, a deformable pad 94 according to the second embodiment is disposed between the upper surface 86 of a polishing table 88 and the lower surface 82 of a polishing pad 84. The discontinuous top surface of the deformable pad 94 is formed by the top surfaces 104 of each of the solid supports 102 and is attached directly to the lower surface 82 of a polishing pad 84 by known means such as those discussed in relation to the first embodiment. However, instead of a discontinuous bottom surface, the ventral layer 96 includes a continuous bottom surface 100, which also forms the bottom surface of the deformable pad 94 according to the second embodiment. The continuous bottom surface 100 of the ventral layer 96 may be directly attached to the upper surface 86 of the polishing table 88 (as shown in FIG. 7), or, where an additional layer of material is included, such as, for example, a protective RODEL® SUBA IV pad, the continuous bottom surface 100 of the ventral layer 96 may be indirectly attached to the upper surface 86 (as shown in FIG. 8) through attachment to an upper surface of the additional layer of material. Again, known means such as those discussed in relation to the first embodiment may be used to directly or indirectly attach the continuous bottom surface 100 of the ventral layer 96 to the upper surface 86 of the polishing table 88.

Figure 9:
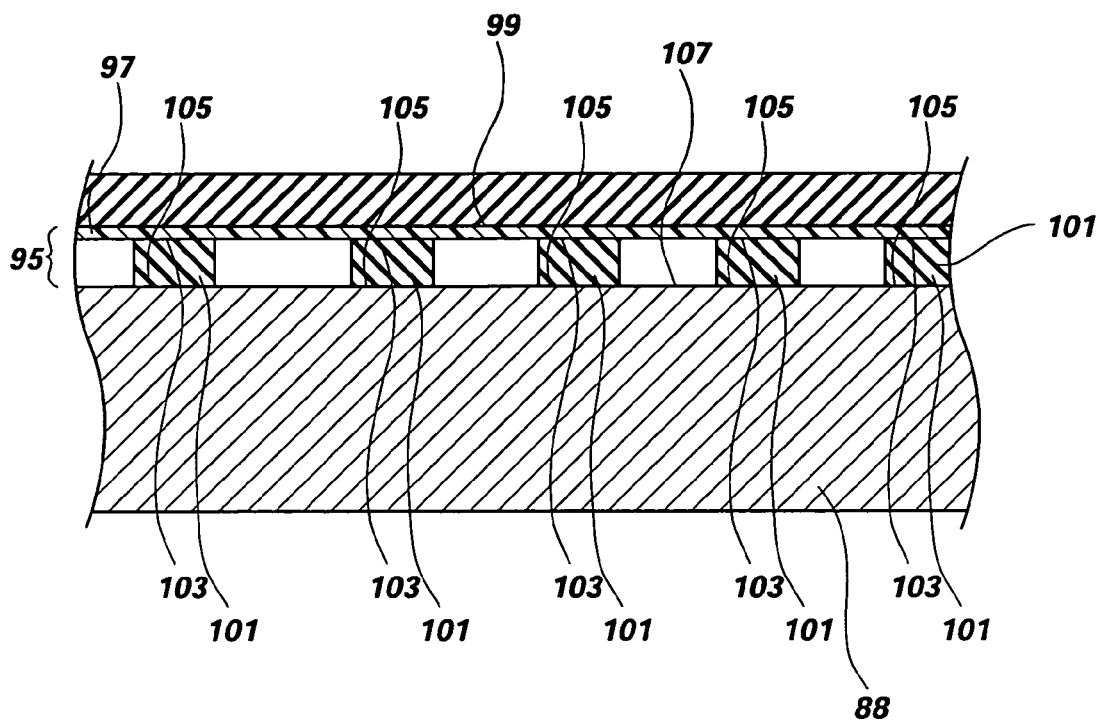
FIG. 9 provides a schematic illustration of a cross-section of a portion of a polishing table useful for CMP processing having a deformable pad according to a third embodiment of the deformable pad of the present invention attached thereto.
Figure 10:
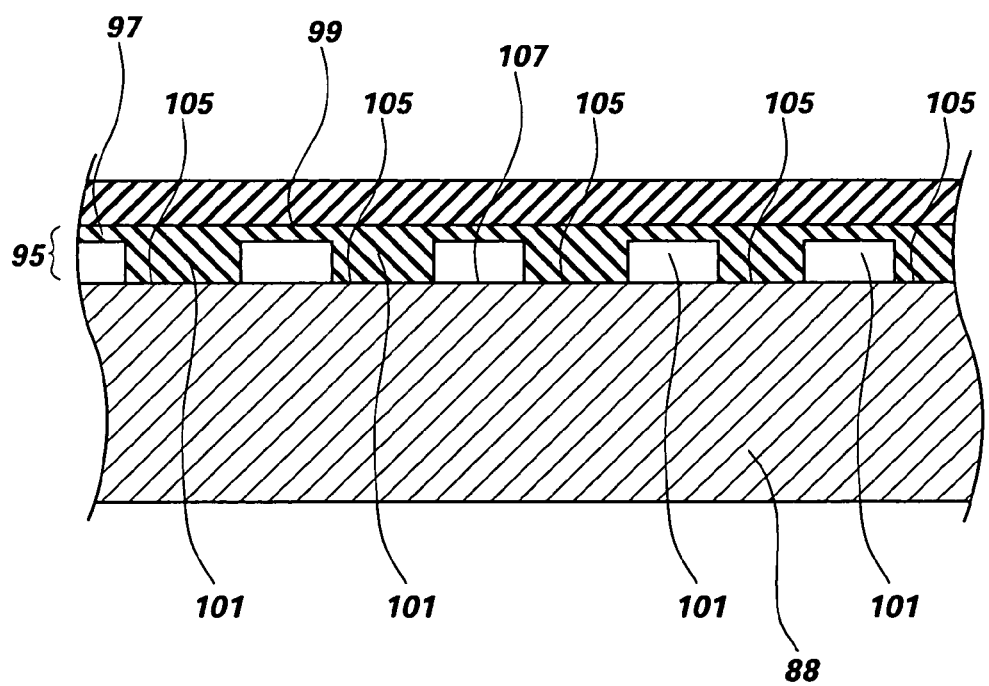
FIG. 10 provides a schematic illustration of a deformable pad according to the third embodiment of the deformable pad of the present invention having a dorsal layer formed integrally with a plurality of solid supports and being attached to an upper surface of a polishing table useful in CMP processing.

Instead of having a ventral layer forming a continuous bottom surface, a third embodiment of the deformable pad 95 (shown in FIG. 9) of the present invention includes a dorsal layer 97 forming a continuous top surface 99, a plurality of solid supports 101, each of the solid supports 101 having a top surface 103 and a bottom surface 105, and a discontinuous bottom surface 107 formed by the bottom surfaces 105 of the solid supports 101. The solid supports 101 of the third embodiment of the deformable pad 95 of the present invention may also be formed integrally with the dorsal layer 97, as is shown in FIG. 10.

As was true of the ventral layer of the second embodiment, the dorsal layer of the third embodiment may be fabricated using a variety of materials. However, the dorsal layer must be fabricated of flexible or resilient materials, such as natural or synthetic rubbers, thermoplastic elastomers, or woven or unwoven fabrics, including impregnated fabrics, such as polyurethane impregnated felt. It must be noted, however, that these materials are provided for example only. Any suitable material providing desired physical characteristics, such as, for example, durability, elasticity, or chemical resistance, may be used to fabricate the dorsal layer of the third embodiment. As was true with the ventral layer described in relation to the second embodiment of the deformable pad, the dorsal layer may also be a composite material including two or more materials or material layers.

Figure 11:
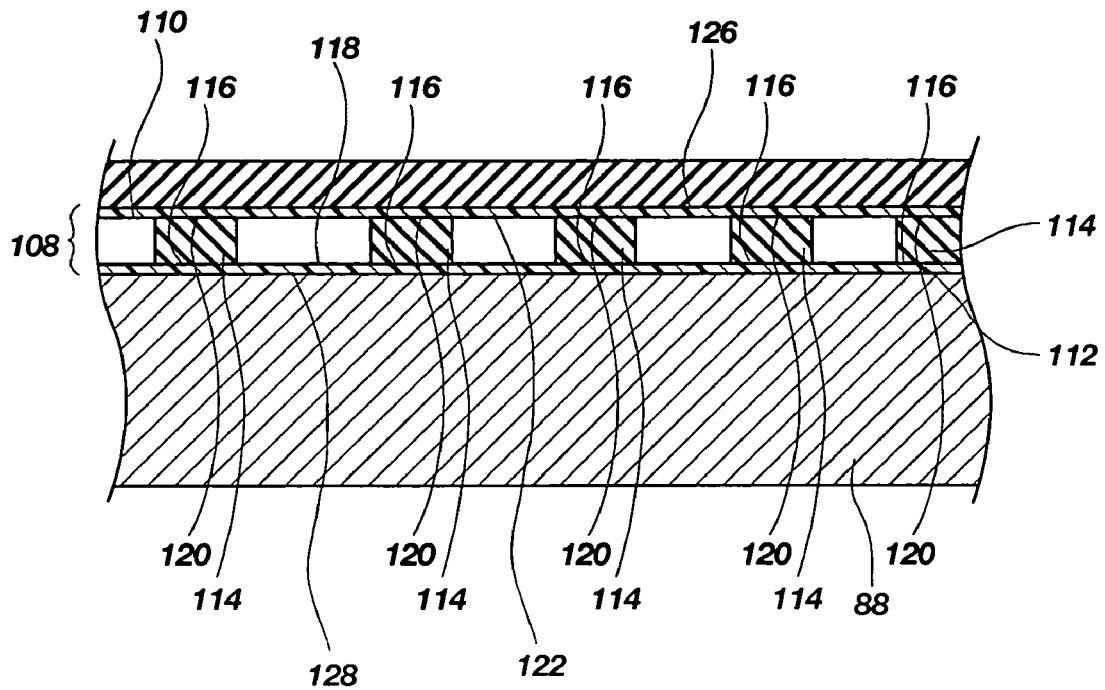
FIG. 11 provides a schematic illustration of a cross-section of a portion of a polishing table useful for CMP processing having a deformable pad according to a fourth embodiment of the deformable pad of the present invention attached thereto.

In yet a fourth embodiment, illustrated in FIG. 11, the deformable pad 108 of the present invention includes a dorsal layer 110, a ventral layer 112, and a plurality of solid supports 114. As can be seen in FIG. 11, the solid supports 114 of the fourth embodiment are disposed between the dorsal and ventral layers 110, 112. The bottom surfaces 116 of the solid supports 114 are attached to the top surface 118 of the ventral layer 112, and the top surfaces 120 of the solid supports 114 are attached to the bottom surface 122 of the dorsal layer 110. Alternatively, the solid supports 114 may be formed integrally with the dorsal layer 110, the ventral layer 112, or both the dorsal layer 110 and ventral layer 112. Where the top surfaces 120 or bottom surfaces 116 of solid supports 114 must be attached to either the ventral layer 112 or dorsal layer 110, any suitable attachment means, such as those discussed in relation to the second and third embodiments, may be used.

As is easily understood by reference to FIG. 11, the dorsal layer 110 and the ventral layer 112 of the fourth embodiment provide a continuous top surface 126 and bottom surface 128, respectively. Therefore, the deformable pad 108 of the fourth embodiment includes continuous top and bottom surfaces 126, 128, and the deformable pad 108 of the present invention may be directly or indirectly attached to a polishing pad or to the upper surface of a polishing table by known means and methods, such as those discussed in relation to the preceding embodiments.

The ventral and dorsal layers 110, 112 of the deformable pad 108 according to the fourth embodiment may be formed of any suitable material. For example, those materials discussed in relation to the ventral layer and dorsal layers of the preceding embodiments may also be used to form the dorsal and ventral layers 110, 112 of the fourth embodiment. Again, however, such materials are provided for example only, and one of ordinary skill in the art will appreciate that any material providing desired physical characteristics, such as desired resiliency, stiffness, durability, etc., may be used. Advantageously, the physical characteristics of the dorsal layer and the ventral layer may be varied to provide, in combination, desired performance characteristics that may not be otherwise obtainable using only a ventral layer or a dorsal layer. Moreover, the ventral and dorsal layers may be composite layers fabricated from two or more materials or material layers that together provide physical characteristics that would be difficult or impossible to achieve using a single material.

Though each of the embodiments of the deformable pad of the present invention is illustrated as it may be used in conjunction with polishing machinery including a rotatable polishing table, such illustrations do not limit the application of the deformable pad of the present invention. Each of the embodiments of the deformable pad of the present invention may also be used in conjunction with linear polishing machinery or any other polishing apparatus where a deformable pad of the present invention may be used to provide enhanced polishing uniformity.

As can be seen in FIG. 5 through FIG. 11, each of the embodiments of the deformable pad of the present invention includes a plurality of solid supports, and each of the solid supports is isolated from the other solid supports included in the deformable pad. Isolation of each of the solid supports is functionally significant because such isolation substantially blocks the formation of nonuniform von Mises stresses by eliminating accumulation of deformation of the polishing pad at the edges of the surface of the material layer being polished. Unlike a continuous layer of resilient material or a matrix of material including a plurality of gas or liquid filled cells therein, both of which approaches allow transmission and accumulation of mechanical stresses and material deformation, the isolated supports of the deformable pad of the present invention form a discontinuous layer of resilient material which prevents transmission and accumulation of stress and material deformation. Therefore, the deformable pad of the present invention substantially eliminates accumulation of nonuniform von Mises stresses across the surface of the material layer being polished, thereby substantially eliminating any resultant edge effects.

In each of the embodiments of the deformable pad of the present invention, the solid supports are easily adaptable to optimize the polishing rate and uniformity of polishing in virtually any CMP process. The solid supports included in each of the embodiments of the deformable pad of the present invention are made of a solid material, and solid materials exhibit a wider array of easily controlled physical properties relative to fluid or gas filled cushions. Again, as it is used in the context of the present invention, the term "solid" excludes materials incorporating cells of gas or liquid within the matrix of the material. Thus, as it is used in the context of this invention, the term "solid" excludes foamed materials.

Yet, numerous materials are suitable for use in formation of the solid supports of the deformable pad of the present invention. For example, resilient materials, such as natural or synthetic rubbers, thermoplastic elastomers, or impregnated fabrics, such as polyurethane impregnated felt may all be used to create the solid supports of the deformable pad of the present invention. The physical characteristics of the solid supports of the deformable pad of the present invention are, therefore, easily modified simply by changing the solid material used to form the solid supports.

The physical characteristics of the solid supports of the deformable pad of the present invention may also be altered by adjusting the physical characteristics of the solid material used to fabricate the solid supports or by forming the solid supports using more than one solid material. For example, as is known in the art, a particular material may be fabricated in varying densities to provide solid supports which are more or less resilient, or, alternatively, the density of the material used in each solid support may be prepared such that the material is progressively more or less dense, thereby providing a progressive resilience.

Figure 14:
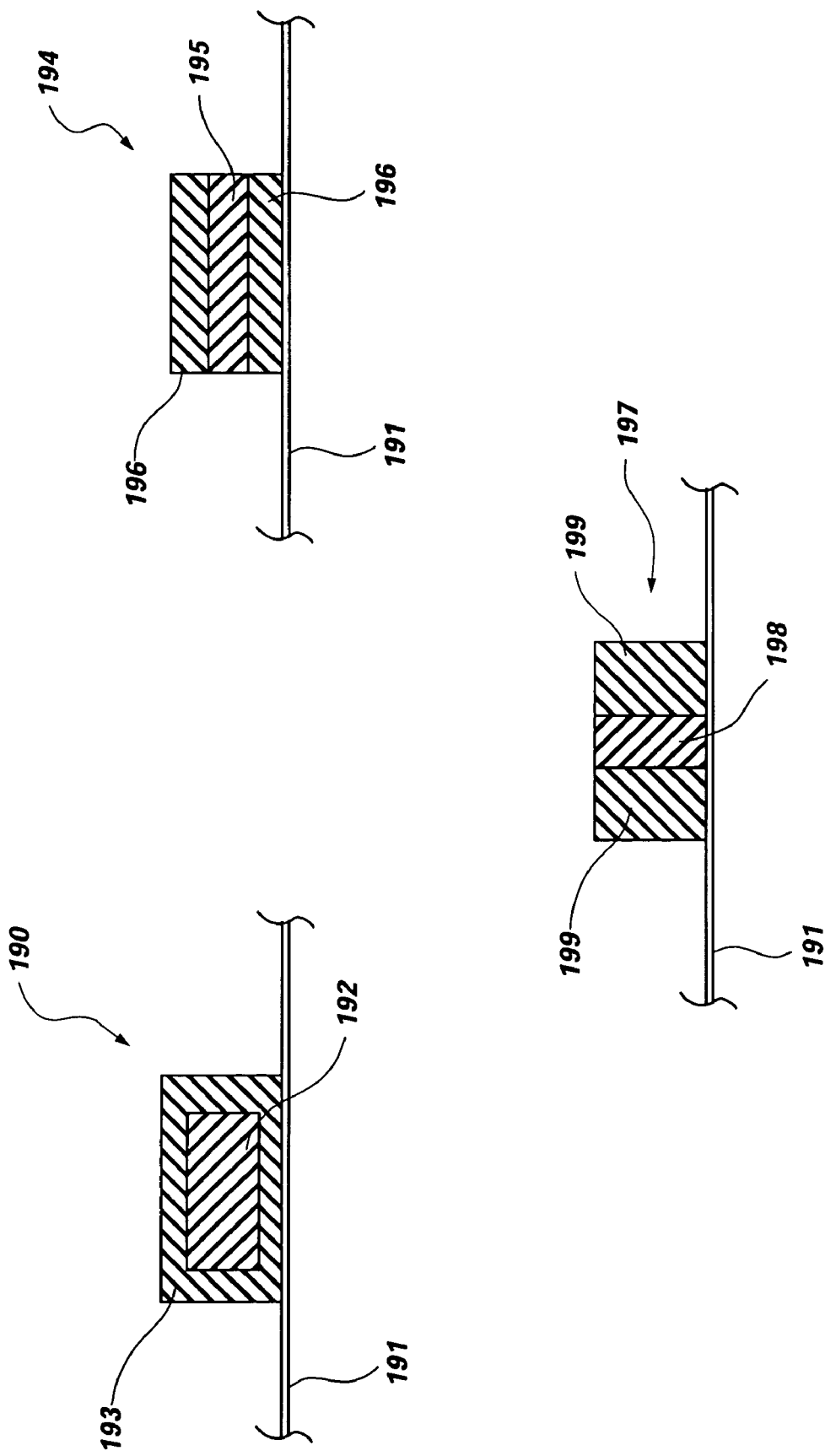
FIG. 14 schematically illustrates solid supports fabricated of more than one solid material for use in a deformable pad of the present invention.

Alternatively, solid supports having desired physical characteristics may be achieved by forming the solid supports out of more than one solid material. For example, as is illustrated in FIG. 14, a solid support 190 of a deformable pad 191 of the present invention may include a core material 192 exhibiting a first set of physical properties surrounded by a casing material 193 exhibiting a second set of physical properties, or a solid support 194 may be formed by stacking two or more different solid materials 195, 196 exhibiting different physical characteristics. Further, a solid support 197 may be formed using a first solid material 198 wrapped in a second peripheral solid material 199. The solid supports may be fabricated using a composite of two or more resilient materials or one or more resilient materials combined with one or more nonresilient materials, such as organic or inorganic polymers, ceramics, or metals, such as aluminum, stainless steel, and copper. Composite solid supports, such as those illustrated in FIG. 14, may be used to achieve solid supports exhibiting one or more desired physical characteristics not achievable through use of a single solid material.

Any combination of solid supports may be used within a deformable pad of the present invention in order to optimize uniformity of polishing in a variety of contexts. For example, a deformable pad of the present invention may include a plurality of solid supports made from a single solid material, or, alternatively, a deformable pad of the present invention may include a plurality of solid supports including only composite solid supports, such as those illustrated in FIG. 14, or a deformable pad of the present invention may include a plurality of solid supports including one or more solid supports formed of a single material as well as one or more composite solid supports. As should be easily appreciated by one of skill in the art, the physical characteristics of a deformable pad of the present invention can be modified to suit a variety of CMP applications simply by altering the solid material(s) used to form the solid supports of the deformable pad.

Figure 15:
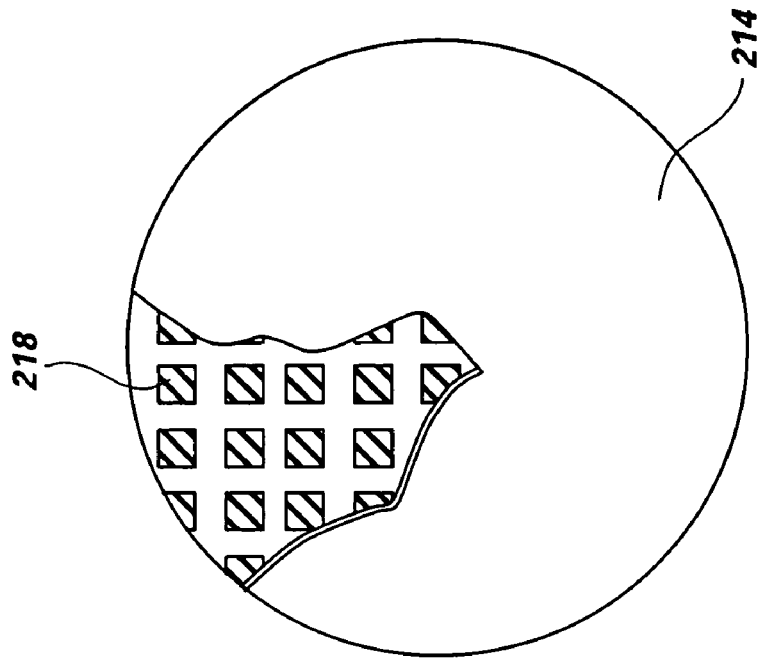
FIG. 15 schematically illustrates first and second deformable pads according to the present invention. The first deformable pad includes more solid supports per unit area than the second deformable pad.
Figure 15:
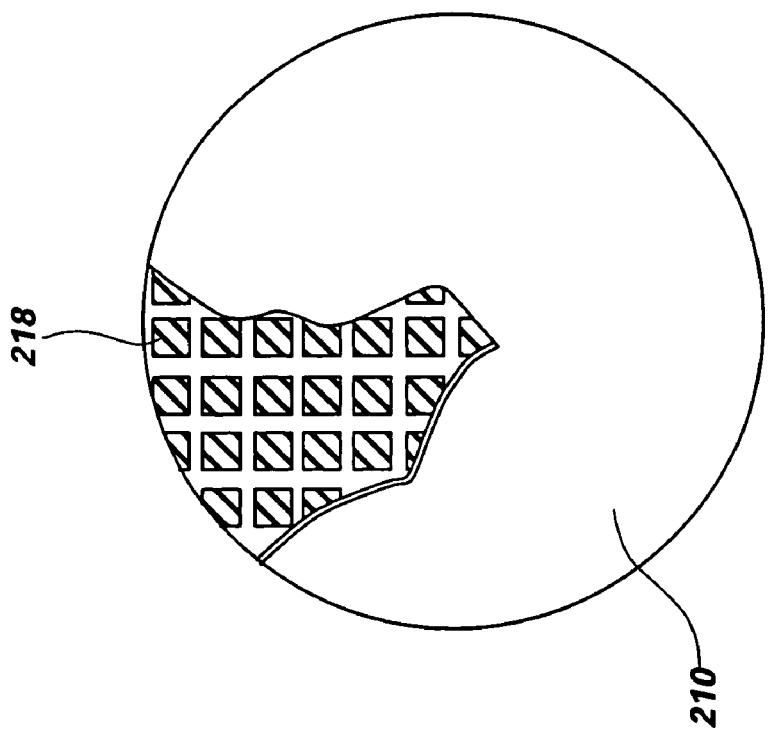
Figure 16:
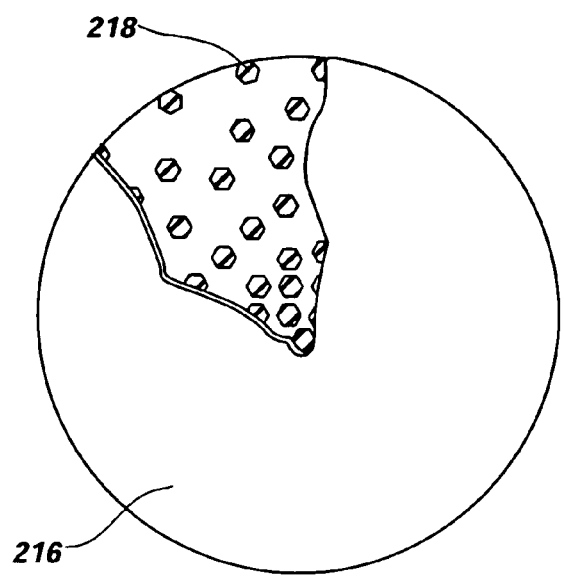
FIG. 16 provides a schematic illustration of a deformable pad of the present invention including a plurality of solid supports distributed in varying densities.

The physical characteristics of a deformable pad of the present invention may also be modified by altering the distribution of the solid supports included in the deformable pad. For example, a first deformable pad 210 (FIG. 15) including more solid supports 218 per unit area will tend to be less resilient than a second deformable pad 214 fabricated of similar materials but having less solid supports 218 per unit area. Additionally, as can be seen in FIG. 16, a deformable pad 216 of the present invention may include a plurality of the solid supports 218 distributed in varying densities within the deformable pad 216. Those areas within the deformable pad 216 including more solid supports 218 per unit area will tend to be less resilient than those areas of the deformable pad 216 including less solid supports 218 per unit area. Altering the distribution of the solid supports included in the plurality of solid supports of a deformable pad of the present invention provides another means by which the physical characteristics of the deformable pad of the present invention may be optimized to enhance polishing uniformity in a variety of CMP applications.

Figure 17:
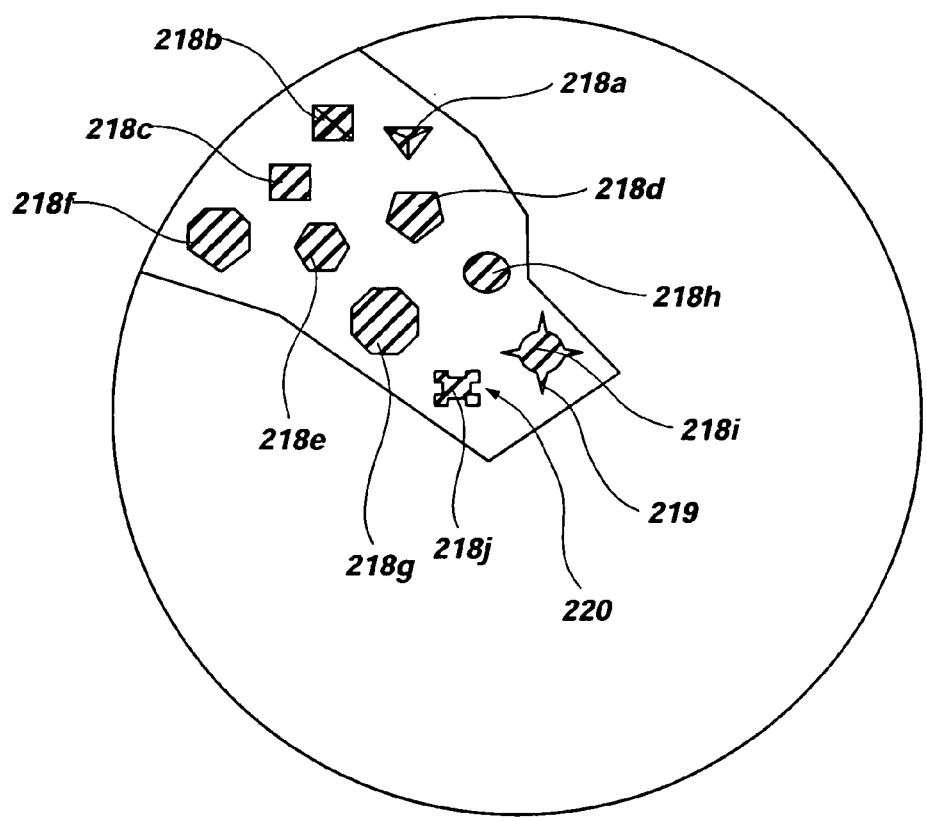
FIG. 17 schematically illustrates top views of various differently shaped solid supports for use in a deformable pad of the present invention.
Figure 18:
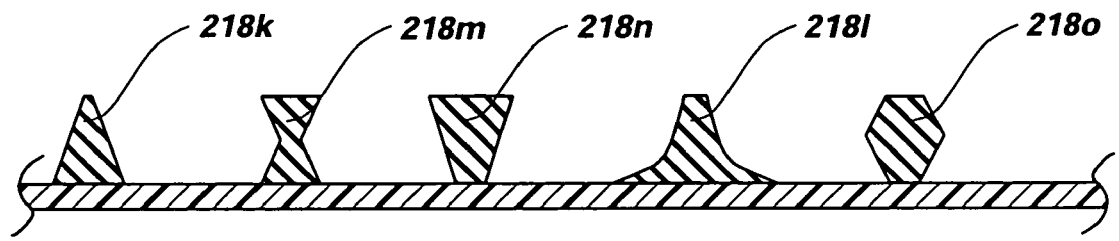
FIG. 18 schematically illustrates side views of additional differently shaped solid supports for use in a deformable pad of the present invention.
Figure 19:
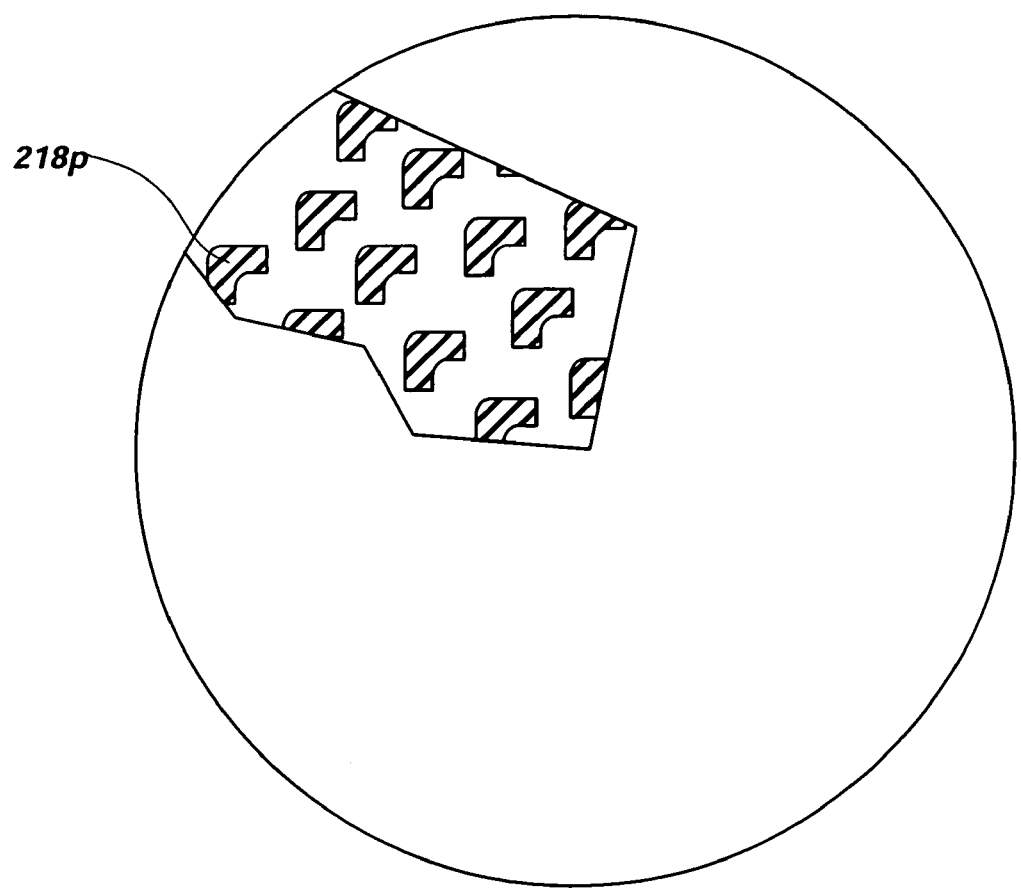
FIG. 19 provides a schematic illustration of a deformable pad of the present invention including a plurality of irregularly shaped solid supports.

The size and shape of the solid supports included in a deformable pad of the present invention may also be varied in order to alter or optimize the physical properties of the deformable pad. For example, as shown in FIG. 17, which schematically illustrates top views of various differently shaped solid supports, the solid supports of a deformable pad of the present invention may be multifaceted (i.e., pyramidal 218*a* and 218*b*, rectangular 218*c*, pentagonal 218*d*, hexagonal 218*e*, heptagonal 218*f*, octagonal 218*g*, or cylindrical 218*h*, etc.), or the solid supports may include flanges 219 or cutouts 220, as can be seen in solid supports 218*i* and 218*j*, respectively. In addition, FIG. 18 shows that the solid supports included in a deformable pad according to the present invention may be conical 218*k* or parabolic 218*l* in shape, or the solid supports may be fabricated with a tapered waist, as can be seen in solid support 218*m*, a tapered bottom section, as can be seen in solid support 218*n*, or tapered top and bottom sections, as shown in solid support 218*o*. As can be further appreciated from reference to FIG. 19, the solid supports included in a deformable pad of the present invention may be formed using irregular shapes, such as solid supports 218*p*, particularly where such irregular shapes enhance desired qualities of the deformable pad of the present invention. Finally, adjusting the height or width of each solid support will also result in solid supports of varying resiliency and durability. For example, a taller, thinner solid support will likely result in a solid support that is less resistant to shearing and compressive forces than a shorter, wider solid support made of the same material. Thus, the solid supports of the deformable pad of the present invention are exceedingly variable, and by varying the size or shape of the solid supports, deformable pads of varying resiliency and durability can be achieved.

Figure 21:
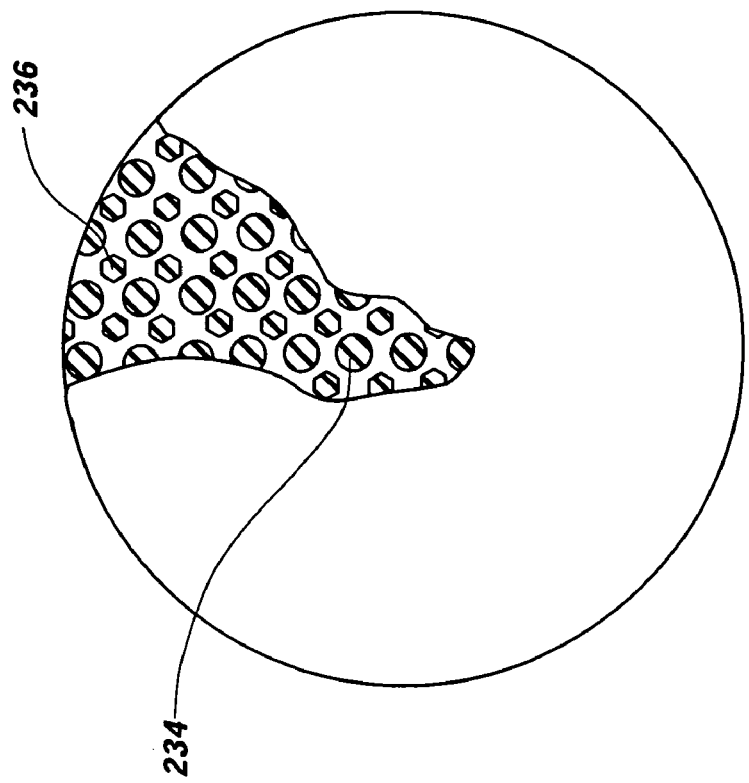
FIG. 21 schematically illustrates a deformable pad of the present invention including a first plurality of solid supports having a first shape and a second plurality of solid supports having a second shape.
Figure 20:
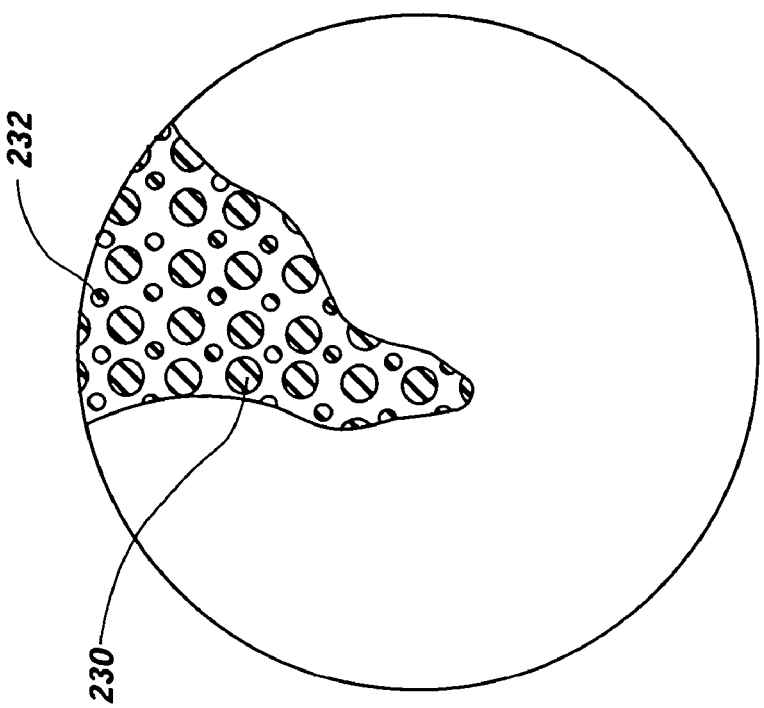
FIG. 20 schematically illustrates a deformable pad of the present invention including a first plurality of solid supports having a first size and a second plurality of solid supports having a second size.
Figure 22:
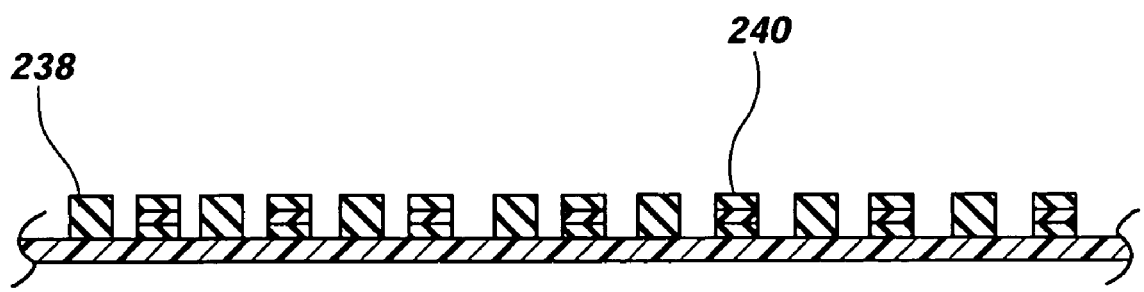
FIG. 22 provides a schematic illustration of a deformable pad of the present invention having a first plurality of solid supports of a first material composition and a second plurality of solid supports of a second material composition.

It should be understood that a deformable pad of the present invention may include a plurality of solid supports including only solid supports which are each made of the same material and of uniform size and shape, or a deformable pad according to the present invention may include a plurality of solid supports including solid supports of different size, shape, or material make-up. For example, as is illustrated in FIG. 20, a deformable pad of the present invention may include a first plurality of solid supports 230 having a first size and a second plurality of second solid supports 232 having a second size. Alternatively, as is shown in FIG. 21, a deformable pad of the present invention may include a first plurality of solid supports 234 of a first shape and a second plurality of solid supports 236 of a second shape. In yet another alternative configuration illustrated in FIG. 22, a deformable pad of the present invention may include a first plurality of solid supports 238 of a first material, or a first set of materials, and a second plurality of solid supports 240 made of a second material, or a second set of materials. The plurality of solid supports included in each of the deformable pads of the present invention may include any number of combinations of solid supports of varying size, shape, or construction. Thus, by combining various different types of solid supports within a single deformable pad, a deformable pad according to the present invention may be fabricated for application in a variety of CMP applications.

The deformable pad of the present invention is therefore highly variable in terms of achievable designs. The solid supports may be fabricated of numerous materials and may be sized, shaped, and distributed to suit a variety of CMP applications. Moreover, where the deformable pad of the present invention further includes dorsal or ventral layers, the potential variability of the physical properties of the deformable pad of the present invention increases. As will be understood by those of ordinary skill in the art, the flexibility in design of the deformable pad of the present invention makes enhanced polishing uniformity available in virtually all CMP applications.

Figure 12:
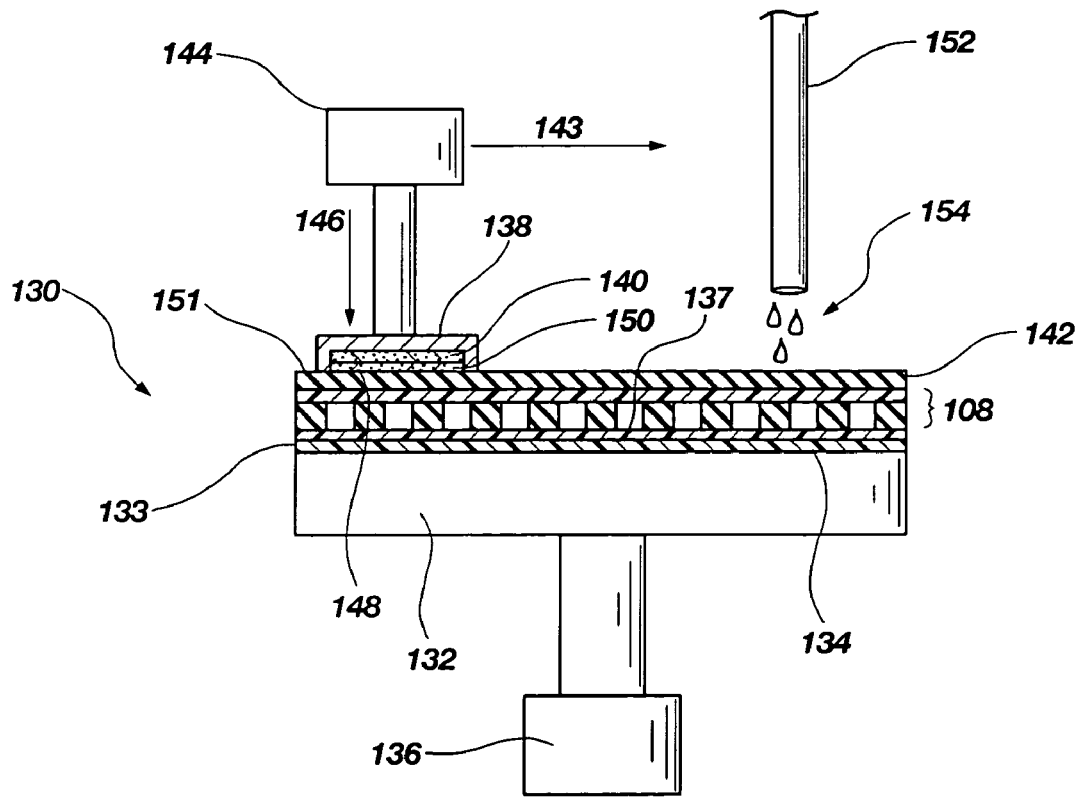
FIG. 12 schematically illustrates a first embodiment of a CMP apparatus according to the present invention including a deformable pad according to the fourth embodiment of the deformable pad of the present invention.

The present invention also includes a polishing apparatus useful in CMP, which incorporates a deformable pad of the present invention. The polishing apparatus of the present invention may further include known machinery used to carry out CMP processes. For example, FIG. 12 illustrates an exemplary polishing apparatus 130 according to the present invention which incorporates a deformable pad 108 according to the fourth embodiment of the deformable pad of the present invention and includes a platen, or polishing table 132, having an upper surface 134 and driven by a mechanical assembly 136 well-known in the art, such as an electric motor. A deformable pad 108 according to the present invention is directly or indirectly attached to the upper surface 134 of the polishing table 132 by any suitable means, such as those already discussed. However, the upper surface 134 of the polishing table 132 may be covered by an additional layer of material 133, such as a protective SUBA IV layer produced by RODEL®. As has been detailed, where an additional layer of material 133 is included on the upper surface 134 of a polishing table 132, the deformable pad 108 is indirectly adhered to or attached to the upper surface 134 of the polishing table 132 by attaching the deformable pad 108 to the upper surface 137 of the additional layer of material 133.

The exemplary polishing apparatus 130 illustrated in FIG. 12 also includes a polishing pad 142, as is known in the art, attached to the deformable pad 108 of the present invention. The polishing pad 142 may be any suitable polishing pad known in the art, such as a RODEL® IC1000 polishing pad, and, as has been previously disclosed, the polishing pad 142 may be attached to the deformable pad 108 by well-known means. Further, the polishing apparatus 130 may include a rotatable substrate carrier 138 which holds the semiconductor substrate 140 in place as the polishing pad 142 or the substrate carrier 138 rotates or otherwise agitates. The substrate carrier 138 of the polishing apparatus 130 may hold the semiconductor substrate 140 in place using well-known techniques. The substrate carrier 138 may be rotatable and may also provide agitation through movement in a plane (indicated by arrow 143) parallel to the upper surface 134 of the polishing table 132. The substrate carrier 138 may also be driven by any one of several known mechanical assemblies 144 known in the art. Additionally, the substrate carrier 138 is designed to exert a downward force (indicated by arrow 146) on the semiconductor substrate 140 substantially normal to the surface 148 of the material layer 150 of the semiconductor substrate 140 being polished, thereby generating a pressure between the surface 148 being polished and the polishing surface 151 of the polishing pad 142.

Figure 13:
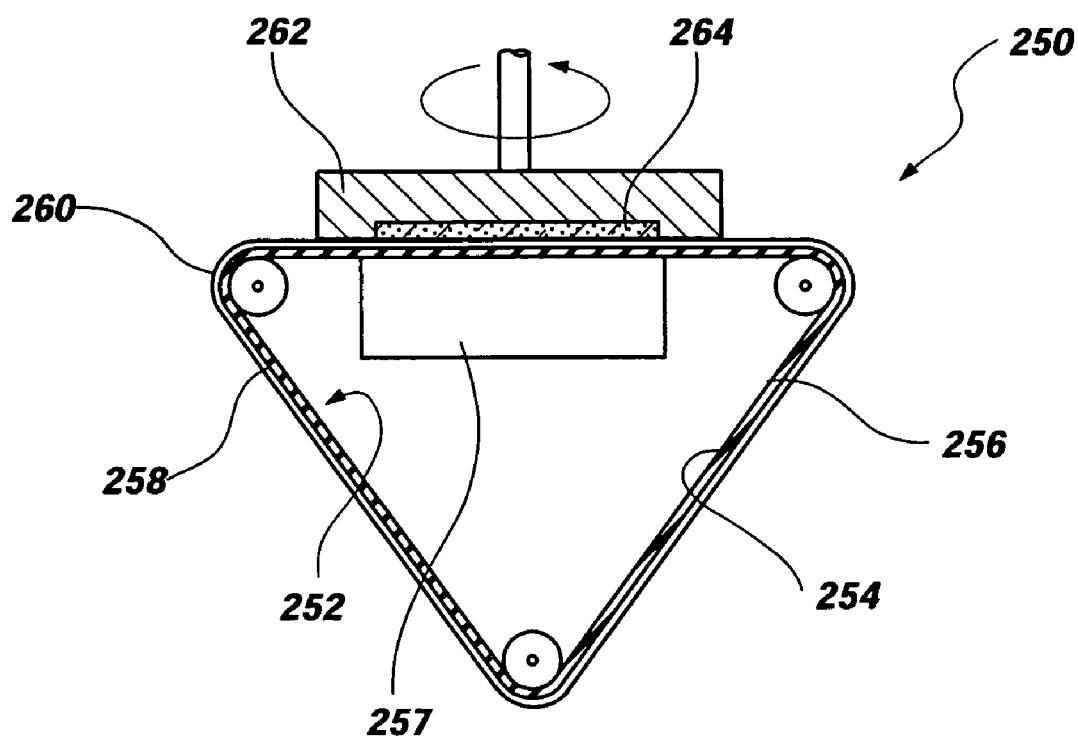
FIG. 13 schematically illustrates a second embodiment of a CMP apparatus according to the present invention including a deformable pad according to the fourth embodiment of the deformable pad of the present invention.

Alternatively, as is shown in FIG. 13, the polishing apparatus of the present invention may include a linear polishing device. A linear polishing apparatus 250 of the present invention includes a continuous belt 252 having an upper surface 254 and a lower surface 256, as well as a belt support 257. A deformable pad 258 of the present invention is attached to the upper surface 254 of the continuous belt 252. A polishing pad 260 is attached to the deformable pad 258 of the present invention and is, therefore, movable along with the continuous belt 252 in a continuous, linear path. The linear polishing apparatus 250 of the present invention also includes a substrate carrier 262. The substrate carrier 262 may hold a substrate 264 to be polished in place using any known technology, such as mechanical affixation, vacuum affixation, frictional affixation, or any other suitable technique. In a preferred embodiment, the substrate carrier 262 of the linear polishing apparatus 250 of the present invention rotates as the continuous belt 252 and associated deformable pad 258 and polishing pad 260 are placed in motion relative to the substrate 264 being polished.

As shown in FIG. 12, the polishing apparatus of the present invention may further include a conduit 152 for delivering a chemical slurry 154 to the polishing surface 151 of the polishing pad 142. Generally the chemical slurry 154 includes an abrasive planarizing agent carried in an ammonium hydroxide solution or the like (not illustrated in FIG. 12). However, the chemical slurry 154 may also include chemicals which etch various materials on the surface 148 of the material layer 150 of the semiconductor substrate 140 to be polished.

The present invention also includes a method for CMP. The method of the present invention includes providing a polishing apparatus having a deformable pad according to the present invention, as well as a polishing pad attached thereto. Again, the polishing pad may be any suitable polishing pad known in the art, such as the RODEL® IC1000. The method of the present invention further includes providing a semiconductor substrate having a surface to be polished. The surface to be polished is then brought into contact with the polishing pad and polished using well-known techniques until the desired planarity or uniformity is achieved. It will be appreciated by those of ordinary skill in the art that the method of the present invention is extremely flexible and may be adapted to accommodate virtually any CMP process.

Though the devices and method of the present invention have been described herein with reference to specific examples, such examples are for illustrative purposes only. The scope of the present invention is defined by the appended claims and is, therefore, not limited by the preceding description and drawings.

What is claimed is:

1. A pad for chemical mechanical polishing comprising:
    a polishing layer; and
    a deformable layer attached to the polishing layer, the deformable layer comprising a plurality of laterally isolated, compressibly deformable solid supports, at least one of a size of the solid supports, a shape of the solid supports, a density of the solid supports, an elasticity of the solid supports, a material composition of the solid supports, and a distribution of the solid supports in the deformable layer varying in at least one direction parallel to a polishing surface of the polishing layer, wherein the deformable layer further comprises a ventral and a dorsal layer.

2. The pad of claim 1, wherein at least one of the ventral layer and the dorsal layer is integrally formed with the plurality of solid supports.

3. A pad for chemical mechanical polishing comprising:
    a polishing layer; and
    a deformable layer attached to the polishing layer, the deformable layer comprising a plurality of laterally isolated, compressibly deformable solid supports, at least one of a size of the solid supports, a shape of the solid supports, a density of the solid supports, an elasticity of the solid supports, a material composition of the solid supports, and a distribution of the solid supports in the deformable layer varying in at least one direction parallel to a polishing surface of the polishing layer, and wherein the plurality of solid supports comprises two or more elastically deformable materials.

4. The pad of claim 3, wherein each solid support of the plurality of solid supports comprises two or more elastically deformable materials.

5. The pad of claim 3, wherein each material of the two or more elastically deformable materials has a different elasticity.

6. A pad for chemical mechanical polishing comprising:
a polishing layer having a polishing surface; and
a deformable layer attached to the polishing layer, the deformable layer comprising a plurality of laterally isolated solid supports, a density of the solid supports in the deformable layer varying in at least one direction parallel to a polishing surface of the polishing layer.

7. The pad of claim 6, wherein the deformable layer further comprises at least one of a ventral layer and a dorsal layer.

8. The pad of claim 6, wherein the density of the solid supports in the deformable layer varies in a radial direction between a central region of the deformable layer and a peripheral region of the deformable layer.

* * * * *

UNITED STATES PATENT AND TRADEMARK OFFICE
CERTIFICATE OF CORRECTION

PATENT NO.         : 7,568,970 B2  
APPLICATION NO. : 11/447741  
DATED                  : August 4, 2009  
INVENTOR(S)       : Dapeng Wang Page 1 of 1

It is certified that error appears in the above-identified patent and that said Letters Patent is hereby corrected as shown below:

In column 14, line 43, in claim 1, after "ventral" insert -- layer --.

Signed and Sealed this

Thirteenth Day of October, 2009

David J. Kappos  
*Director of the United States Patent and Trademark Office*